United States Patent [19]

Aspnes et al.

[11] Patent Number: 4,931,132
[45] Date of Patent: Jun. 5, 1990

[54] OPTICAL CONTROL OF DEPOSITION OF CRYSTAL MONOLAYERS

[75] Inventors: David E. Aspnes, Watchung; Rajaram Bhat, Red Bank; Etienne G. Colas, Asbury Park; Leigh T. Florez, Atlantic Highlands; James P. Harbison, Fair Haven; Ambrose Studna, Raritan, all of N.J.

[73] Assignee: Bell Communications Research, Inc., Livingston, N.J.

[21] Appl. No.: 255,140

[22] Filed: Oct. 7, 1988

[51] Int. Cl.$^5$ .................. C30B 25/16; C30B 23/02; C30B 35/00; B05C 11/00
[52] U.S. Cl. .................. 156/601; 156/610; 156/613; 422/108; 422/245; 427/255.1; 118/665; 118/688; 118/691
[58] Field of Search .............. 156/601, 611, 610, 613, 156/614, DIG. 70, DIG. 103, 626, 627; 118/690, 691, 665, 688; 427/255.1, 255.2, 255.7; 437/61; 422/108, 245

[56] References Cited

U.S. PATENT DOCUMENTS

| | | | |
|---|---|---|---|
| 4,058,430 | 11/1977 | Suntola et al. | 156/611 |
| 4,141,780 | 2/1979 | Kleinknecht et al. | 156/626 |
| 4,405,989 | 9/1983 | Tsukada et al. | 156/627 |
| 4,413,022 | 11/1983 | Suntola et al. | 427/255.7 |
| 4,511,800 | 4/1985 | Harbeke et al. | 250/372 |
| 4,564,997 | 1/1986 | Matsuo et al. | 437/61 |
| 4,575,462 | 3/1986 | Dobson et al. | 156/601 |
| 4,766,317 | 8/1988 | Harbeke et al. | 250/372 |
| 4,806,321 | 2/1989 | Nishizawa et al. | 156/601 |

OTHER PUBLICATIONS

"GaAs/AsGaAs Quantum Well Lasers with Active Regions Grown by Atomic Layer Epitaxy", *Applied Physics Letters*, S. P. Den Baars et al., 1987, vol. 51, No. 9, pp. 1530–1532.
"Perpendicular-Incidence Null Ellipsometry of Surfaces with Arbitrary Anisotropy", *Optical Engineering*, R. M. A. Azzam, 1981, vol. 20, pp. 58–61.
"Perpendicular-Incidence Ellipsometry (PIPE) of Surfaces with Arbitrary Anisotropy", *Journal Optics* (Paris), R. M. A. Azzam, 1981, vol. 12, pp. 317–321.
"Anisotropies in the Above-Band-Gap Optical Spectra of Cubic Semiconductors", *Physical Review Letters*, D. E. Aspnes et al., 1985, vol. 54, pp. 1956–1959.
"Above-Bandgap Optical Anisotropies in Cubic Semiconductors: A Visible-Near Ultraviolet Probe of Surfaces", *Journal of Vacuum Science and Technology*, D. E. Aspnes, 1985, vol. B3, pp. 1498–1506.
"Optical Reflectance and RHEED Transients During MBE Growth on (001) GaAS", *Materials Research Society Symposium Proceedings*, D. E. Aspnes et al., 10/9/87, vol. 91, pp. 57–62.
"Optical-Reflectance and Electron-Diffraction Studies of Molecular-Beam-Epitaxy Growth Transients on GaAs (001)", *Physical Review Letters*, D. E. Aspnes et al., 1987, vol. 59, pp. 1687–1690.
"Reflectance-Difference Spectroscopy System for Real-Time Measurements of Crystal Growth", *Applied Physics Letters*, D. E. Aspnes et al., 1988, vol. 52, pp. 957–959.
"Optical Studies of Molecular-Beam Epitaxy Growth of GaAs and AlAs", *Journal of Vacuum Science and Technology*, D. E. Aspnes et al., 1988, vol. B6, pp. 1127–1131.
"Oscillations in the Optical Response of (001) GaAs and AlGaAs Surfaces During Crystal Growth by Molecu-

(List continued on next page.)

Primary Examiner—Gary P. Straub
Attorney, Agent, or Firm—James W. Falk; Charles S. Guenzer

[57] ABSTRACT

A method and apparatus for epitaxial growth of precisely one monolayer. The growth is by organometallic chemical vapor deposition in which the substrate is alternately exposed to the anion and cation of a III–V compound. During deposition of the cation, for instance Ga or Al, reflectance difference spectroscopy is performed to obtain the difference of reflected light beams polarized in orthogonal directions. A growth of a monolayer and even of a partial monolayer can be monitored in real time.

19 Claims, 9 Drawing Sheets

OTHER PUBLICATIONS lar Beam Epitaxy", *Applied Physics Letters,* J. P. Harbison et al., 1988, vol. 52, pp. 2046–2048.

"Optical Reflectance Measurements of Transients During Molecular Beam Epitaxial Growth on (001) GaAs", *Journal of Vacuum Science and Technology,* J. P. Harbison et al., 1988, vol. B6, pp. 740–742.

"Application of Reflectance Difference Spectroscopy to Molecular-Beam Epitaxy Growth of GaAs and AlAs", *Journal of Vacuum Science and Technology,* D. E. Aspnes et al., 1988, vol. A6, pp. 1327–1332.

"Molecular-Beam Epitaxy Growth of Tilted GaAs/AlAs Superlattices by Deposition of Fractional Monolayer on Vicinal (001) Substrates", *Journal of Vacuum Science and Technology,* J. M. Gaines et al., 1988, vol. B6, pp. 1378–1331.

"GaAs/AsGaAs Quantum Well Lasers with Active Regions Grown by Atomic Layer Epitaxy'", *Applied Physics Letters,* S. P. Den Baars et al., 1987, vol. 51, No. 9, pp. 1530–1532.

"Perpendicular-Incidence Null Ellipsometry of Surfaces with Arbitrary Anisotropy", *Optical Engineering,* R. M. A. Azzam, 1981, vol. 20, pp. 58–61.

"Perpendicular-Incidence Ellipsometry (PIPE) of Surfaces with Arbitrary Anisotropy", *Journal Optics (Paris), R. M. A. Azzam, 1981, vol. 12, pp. 317–321.*

"Anisotropies in the Above-Band-Gap Optical Spectra of Cubic Semiconductors", *Physical Review Letters,* D. E. Aspnes et al., 1985, vol. 54, pp. 1956–1959.

"Above-Bandgap Optical Anisotropies in Cubic Semiconductors: A Visible-Near Ultraviolet Probe of Surfaces", *Journal of Vacuum Science and Technology,* D. E. Aspnes, 1985, vol. B3, pp. 1498–1506.

"Optical Reflectance and RHEED Transients During MBE Growth on (001) GaAs", *Materials Research Society Symposium Proceedings,* D. E. Aspnes et al., 10/9/87, vol. 91, pp. 57–62.

"Optical-Reflectance and Electron-Diffraction Studies of Molecular-Beam-Epitaxy Growth Transients on GaAs (001)", *Physical Review Letters,* D. E. Aspnes et al., 1987, vol. 59, pp. 1687–1690.

"Reflectance-Difference Spectroscopy System for Real-Time Measurements of Crystal Growth", *Applied Physics Letters,* D E. Aspnes et al., 1988, vol. 52, pp. 957–959.

"Optical Studies of Molecular-Beam Epitaxy Growth of GaAs and AlAs", *Journal of Vacuum Science and Technology,* D. E. Aspnes et al., 1988, vol. B6, pp. 1127–1131.

"Oscillations in the Optical Response of (001) GaAs and AlGaAs Surfaces During Crystal Growth by Molecular Beam Epitaxy", *Applied Physics Letters,* J. P. Harbison et al., 1988, vol. 52, pp. 2046–2048.

"Optical Reflectance Measurements of Transients During Molecular Beam Epitaxial Growth on (001) GaAs", *Journal of Vacuum Science and Technology,* J. P. Harbison et al., 1988, Vol. B6, pp. 740–742.

"Application of Reflectance Difference Spectroscopy to Molecular-Beam Epitaxy Growth of GaAs and AlAs", *Journal of Vacuum Science and Technology,* D. E. Aspnes et al., 1988, vol. A6, pp. 1327–1332.

"Molecular-Beam Epitaxy Growth of Tilted GaAs/AlAs Superlattices by Deposition of Fractional Monolayer on Vicinal (001) Substrates", *Journal of Vacuum Science and Technology,* J. M. Gaines et al., 1988, vol. B6, pp. 1378–1331.

OPTICAL CONTROL OF DEPOSITION OF CRYSTAL MONOLAYERS

FIELD OF THE INVENTION

The invention relates to controlling the number of layers of atoms deposited by a vapor phase deposition method.

BACKGROUND OF THE INVENTION

There has been significant effort expended in recent research on advanced semiconductor devices which rely upon very thin layers of a particular semiconductor composition. For instance, in one type of quantum well laser, an active layer of GaAs separates two layers of GaAlAs. Although the thickness of the GaAlAs layers need not be precisely controlled, the thickness of the GaAs layer must be precisely controlled to a predetermined number of atomic layers (monolayers) falling within the range of 10 to 100 monolayers. The accuracy of the thickness must be in the range of one to two monolayers.

One method of achieving such control in a III-V semiconductor is atomic layer epitaxy (ALE) as described by Den Baars et al in a technical article entitled "GaAs/AlGaAs quantum well lasers with active regions grown by atomic layer epitaxy" appearing in Applied Physics Letters, Vol. 51, No. 9, 1987 at pages 1530-1532. By atomic layer epitaxy is meant an epitaxial crystal growth process in which a single atomic layer of a crystal, usually a III-V crystal, is deposited on a substrate before the fabrication process is changed and the next atomic layer is grown. In the past, ALE has usually relied on each of the deposition steps being self-limiting so that the exact time devoted to depositing a single layer is not crucial. However, for purposes of this invention, a self-limiting growth process is not assumed.

Den Baars et al used an organometallic chemical vapor deposition (OMCVD) method to be described in more detail later. In OMCVD growth of GaAs, a substrate is exposed to vapors of trimethylgallium (TMGa), which supplies the Ga, and of arsine ($AsH_3$), which supplies the As. The relatively thick GaAlAs layers were grown by the conventional OMCVD method of exposing the substrate simultaneously to TMGa, trimethylaluminum (TMAL) and $AsH_3$. However, the intermediate thin GaAs was required to be 6 nm thick, about 20 GaAs monolayers, and was grown by ALE. In ALE, the (001) substrate was alternately exposed to $AsH_3$ and to TMGa. The exposure times were sufficient to saturate the bonding. Therefore, during the $AsH_3$ exposure, virtually all Ga atoms exposed at the surface became bonded with As so that a monolayer of As was formed over the underlying layer of Ga. Similarly, the exposure to TMGa produced a surface monolayer of Ga overlying the previously formed As monolayer. The above process is repeated to form a precise number of monolayers.

Den Baars et al used fixed exposure times derived from previously obtained growth rates, which they showed to be very temperature dependent near their ALE temperature of 485° C. It is believed that such control is satisfactory for the As deposition since As bonded to As will sublime at rates higher than typical deposition rates even at temperatures as low as 300° C. Therefore, any excess As, that is, As unbonded to the underlying Ga and perhaps still in the form of $AsH_3$, immediately evaporates when the supply of $AsH_3$ is interrupted so that the As is self-limiting. However, Ga does not exhibit such a high vapor pressure (or low sublimation temperature). Therefore, if there has been an excess exposure to TMGa, the Ga condenses into Ga globules on the substrate surface. Upon removal of the TMGa vapor, the Ga in the globules is available for bonding to the As in the subsequently supplied $AsH_3$. Therefore, during the supply of $AsH_3$, the globular Ga can contribute to the formation of one or more GaAs layers. Of course, complete coverage for a Ga or an As monolayer is desired. Hence, for precise monolayer thickness control, exposure times must be accurately controlled in the presence of possible process variations such as temperature and pressure.

It would be desirable to have a real-time or in situ monitor for determining when a monolayer has in fact been deposited and to thereby control the supply of the vapor phases. One well known in situ method for surface analysis is reflection high-energy electron diffraction (RHEED). In RHEED, a high energy electron beam of approximately 8 keV is directed to the substrate surface at a fixed angle and an electron beam thereby reflected or diffracted from the surface at a corresponding angle is monitored. RHEED tests the surface structure. During monolayer formation, the RHEED signal changes, notably periodically in synchronism with the formation of multiple monolayers.

RHEED, however, suffers many drawbacks. RHEED tests the surface structure rather than the chemistry producing that structure. The high energy electrons are destructive and must be directed to a sacrificial portion of the substrate. Most importantly, RHEED is operable only in ultra-high vacuums. As such, RHEED is usable with molecular beam epitaxy (MBE) but cannot be used with OMCVD, which operates near atmospheric pressure. Other types of vapor phase crystal growth also operate at pressures higher than would permit the use of RHEED.

SUMMARY OF THE INVENTION

Accordingly, an object of the invention is to provide a method of real-time monitoring of the growth of crystalline monolayers.

A further object is to provide such a method which is operable at higher pressures for vapor phase growth.

Another object is to provide such a method which is non-destructive of the layers being grown.

Yet another object is to provide such a method which is sensitive to the surface chemistry.

The invention can be summarized as growing a crystalline material by a vapor phase method, such as atomic layer epitaxy using organometallic chemical vapor deposition, and simultaneously monitoring the formation of crystalline monolayers by reflectance difference spectroscopy. In the reflectance difference spectroscopy, light is irradiated on the surface of the sample and the light intensities of the two perpendicular polarizations of light reflected therefrom are compared.

The polarizations are arranged so that the polarization intensity difference changes between successive monolayers.

DETAILED DESCRIPTION

The preferred embodiment of the invention combines organometallic chemical vapor deposition (OMCVD) with the simultaneous operation of a reflectance difference (RD) spectrometer in order to monitor the formation of an atomic monolayer in a III-V semiconductor, such as GaAs.

Of itself, OMCVD is now well known and is gaining increasing use for the fabrication of structured III-V devices. The OMCVD process was disclosed by Ruehrwein in U.S. Pat. No. 3,975,218 and is described in detail in review articles in Chapters 3 and 5 in Semiconductors and Semimetals; Volume 22, Lightwave Communications Technology; Part A, Material Growth Technologies, eds. Willardson and Beer, Academic Press, 1985. An OMCVD reactor is commercially available from Emcore of Plainfield, N.J. In chemical vapor phase growth, the atoms approach the substrate in molecular form and require chemical reaction to become bound to the surface. In OMCVD, at least one of the molecular forms is an organic metal. OMCVD and other forms of vapor phase epitaxy rely on the constituent vapor to be transported to the reacting surface in a carrier gas so that the constituent gas is in thermal equilibrium. Only a brief description of OMCVD will be presented here.

Figure 1:
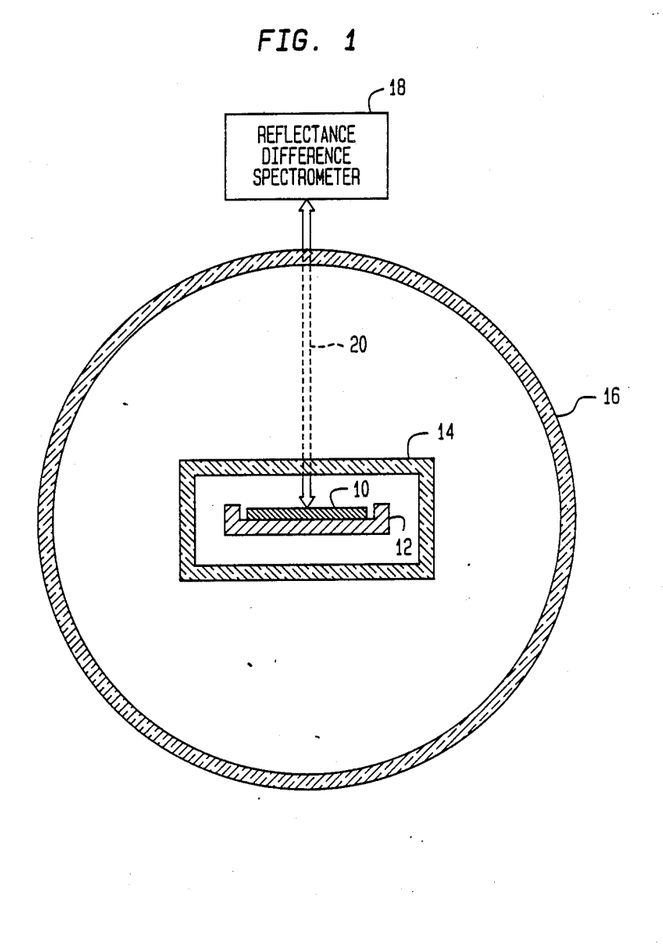
FIG. 1 is an illustration, partly in cross section, of the combination of a reflectance difference (RD) spectrometer and an OMCVD reaction chamber.

As shown in FIG. 1, a substrate 10 is placed in silicon-carbide coated susceptor 12. The substrate 10 is of GaAs with its (001) face facing upward. The susceptor 12 with substrate 10 is placed within a 25 cm$^2$ rectangular tube 14 which in turn is placed within a circular tube 16 of 11 cm diameter. According to OMCVD, a controlled mixture of gases flows along and through the rectangular tube 14 and the gases react with the substrate 10 so as to epitaxially form crystalline layers thereupon. The circular tube 16, among other effects, provides mechanical strength during vacuum pump-down of the rectangular tube 14.

According to the invention, a reflectance difference (RD) spectrometer is placed above the substrate 10 on the outside of the circular tube 16. An optical axis 20 of the RD spectrometer 18 is chosen to be nearly normal to the surface of the GaAs substrate 10. The intensity of the RD light is not of sufficient intensity to affect the crystal growth. The rectangular and circular tubes 14 and 16 are formed of annealed quartz but need not be of optical quality except for the transmissivity and negligible polarization of light of relevant wavelength for the RD spectrometer 18. In the transient measurements to be described polarization by the tubes 14 and 16 is allowed insofar as it does not contribute to a change in the transient. The susceptor 12 and thus the substrate 10 are heated by unillustrated means, such as an RF coil wrapped around the circular tube 16 and connected to a 7.5 kw RF generator operating at 450 kHz. The optical axis 20 may pass between successive turns of the RF coil.

Figure 2:
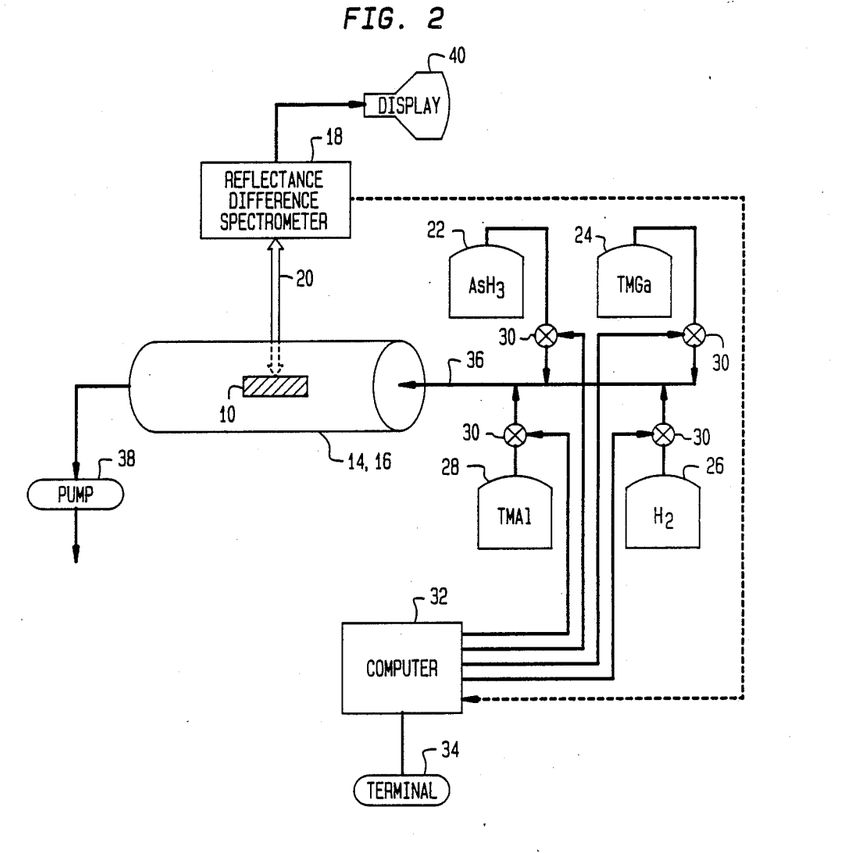
FIG. 2 is a pictorial illustration in a side view corresponding to FIG. 1.

FIG. 2 is a schematic illustration of the OMCVD apparatus. The two vapor phases, AsH$_3$ and TMGa, are supplied from containers 22 and 24. Gaseous hydrogen supplied from container 26 at atmospheric pressure acts as a carrier. Trimethylaluminum (TMAl) from container 28 is used for deposition of aluminum. Flow rates of the gases are closely controlled by flow control valves 30. In practice the flow control valves 30 are under the control of a computer 32 which can operate according to a programmed sequence or under direct operator input from a terminal 34. The RD data transients are displayed on the display 40 for the benefit of the operator and may be directly input to the computer 32 for closed-loop growth control. It is noted that TMGa and TMAl are in fact liquids and must be vaporized into a flow of H$_2$.

Whatever gases are supplied enter a common supply line 36 which enters the tubes 14 and 16. All of the gas is supplied to the rectangular tube 14 in which it flows over the substrate 10 before being vented. The chamber can be pumped during deposition by an exhaust pump 38. Importantly, the pressures within the reaction chamber surrounding the substrate are in the vicinity of atmospheric so that the known reflection high-energy electron diffraction technique (RHEED) is unusable.

Reflectance difference spectroscopy, of itself, is well known. The use of perpendicular incidence RD with anisotropic surfaces is discussed theoretically by Azzam in two technical papers entitled "Perpendicular-incidence null ellipsometry of surfaces with arbitrary anisotropy" appearing in Optical Engineering, Vol. 20, No. 1, pages 58–61 and "Perpendicular-incidence ellipsometry (PIPE) of surfaces with arbitrary anisotropy" appearing in Journal Optics (Paris), Vol. 12, No. 5, 1981 at pages 317–321.

The use of RD with already formed surfaces of Si and of GaAs has been described by Aspnes in a technical article entitled "Above-bandgap optical anisotropies in cubic semiconductors: A visible-near ultraviolet probe of surfaces" appearing in Journal of Vacuum Science and Technology, Vol. B3, 1985 at pages 1498–1506. Earlier work by the same group treated only Si and Ga as described by Aspnes et al in a technical article entitled "Anisotropies in the Above-Band-Gap Optical Spectra of Cubic Semiconductors" appearing in Physical Review Letters, Vol. 54, 1985 at pages 1956 to 1959.

The underlying principle of reflectance difference spectrometry is to measure the reflectance of light at two orthogonal polarizations and to take the difference of the two intensities. Light reflectance is predominantly a bulk effect and III-V compounds have cubic symmetry so that there are at most very small bulk signals. However, a surface breaks the cubic symmetry so that surface effects can provide a very small difference in the reflectances of the two polarizations.

Figure 3:
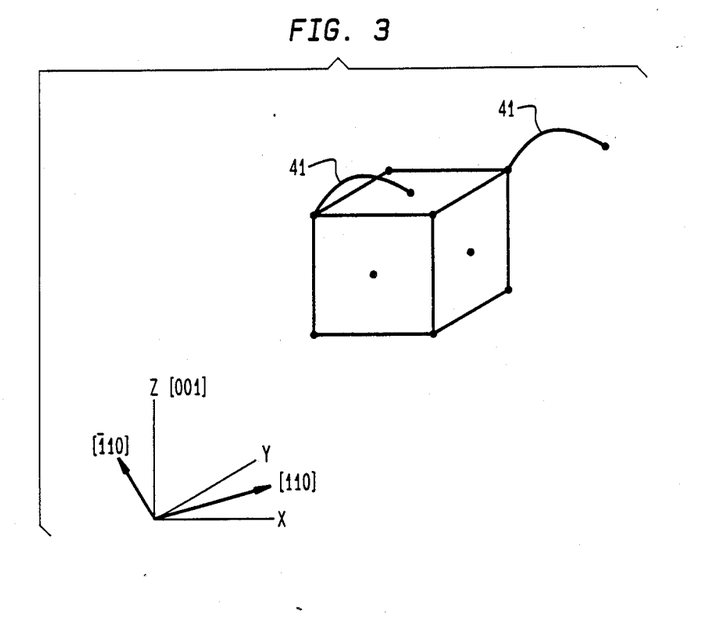
FIG. 3 is an illustration of a crystal lattice.

The basis of the RD signal for III-V compounds is believed to be as follows. GaAs, like other III-V compounds, has a zinc-blende structure. This structure, as illustrated in FIG. 3, consists of one species, for example the Ga, arranged in a face-centered cubic lattice. Then for each illustrated Ga atom, there is an unillustrated As atom displaced by one quarter of the body diagonal. Conventionally, this displacement is in the [+x,+y,+z] direction. This figure also shows how GaAs is grown by atomic layer epitaxy in the [001] direction. If the bottom Ga atoms are already present, exposure to As in the form of AsH$_3$ deposits an As monolayer displaced from the Ga by one quarter a cubic lattice constant along the [001] direction. Then an exposure to Ga in the form of TMGa deposits a Ga monolayer represented by the two atoms illustrated on the vertical side face. The alternating exposures to Ga and As build up the GaAs crystal monolayer by monolayer.

Assume that the process has proceeded to the point illustrated in FIG. 3 so that the top surface consists of Ga atoms. In the bulk, each Ga atom is tetrahedrally bonded to 4 neighboring As atoms. The bonds below the illustrated top surface are completed to two As atoms lying in a plane bisecting the x-y axes, that is, in a plane along the [$\bar{1}$10] direction. However, the bonds above the surface lie in the perpendicular plane, that is the plane including the direction [110] but these bonds cannot find the required As atoms. There results Ga-Ga dimers 41 lying generally along the [110] direction.

In contrast, when the top layer consists of As, As-As dimers are formed but they lie in the perpendicular direction, that is, along [$\bar{1}$10].

As a result of the directionality of the Ga-Ga and As-As dimers, the reflectance of light polarized along either [110] or [$\bar{1}$10] depends on whether the top surface is Ga or is As. Because reflectance is predominantly a bulk effect on an atomic scale, the surface contribution is small. Accordingly, a reflectance difference (RD) between the two polarizations, R(110)-R($\bar{1}$10), is much more sensitive than simply measuring one of the polarized reflectances. Furthermore, it is possible to measure only changes in this reflectance difference over a change of processing condition.

The above described dimer mechanism is fairly well established for MBE growth. Even if it does not directly apply to OMCVD growth, the fact remains that the bonding directions change between the Ga and As layers.

Several embodiments of RD spectrometers have been discussed by the inventors in a series of recent technical papers applying RD spectroscopy to molecular beam epitaxy. These papers are: (1) "Optical reflectance and RHEED transient during MBE growth on (001) GaAs" by Aspnes et al appearing in Materials Research Society Symposium Proceedings, Vol. 91, 1987 at pages 57–62; (2) "Optical-Reflectance and Electron-Diffraction Studies of Molecular-Beam-Epitaxy Growth Transients on GaAs (001)" by Aspnes et al appearing in Physical Review Letters, Vol. 59, Vol. 15, 1987 at pages 1687–1690; (3) "Reflectance-difference spectroscopy system for real-time measurements of crystal growth" by Aspnes et al appearing in Applied Physics Letters, Vol. 52, 1988 at pages 957–959; (4) "Optical Studies of molecular-beam epitaxy growth of GaAs and AlAs" by Aspnes et al appearing in Journal of Vacuum Science and Technology, Vol. B6, 1988 at pages 1127–1131; (5) "Oscillations in the optical response of (001) GaAs and AlGaAs surfaces during crystal growth by molecular beam epitaxy" by Harbison et al appearing in Applied Physics Letters, Vol. 52, 1988 at pages 2046–2048; (6) "Optical reflectance measurements of transients during molecular-beam epitaxial growth on (001) GaAs" by Harbison et al appearing in Journal of Vacuum Science and Technology, Vol. B6, 1988 at pages 740–742; and (7) "Application of reflectance difference spectroscopy to molecular-beam epitaxy growth of GaAs and AlAs" by Aspnes et al appearing in Journal of Vacuum Science and Technology, Vol. A6, 1988 at pages 1327–1332.

Figure 4:
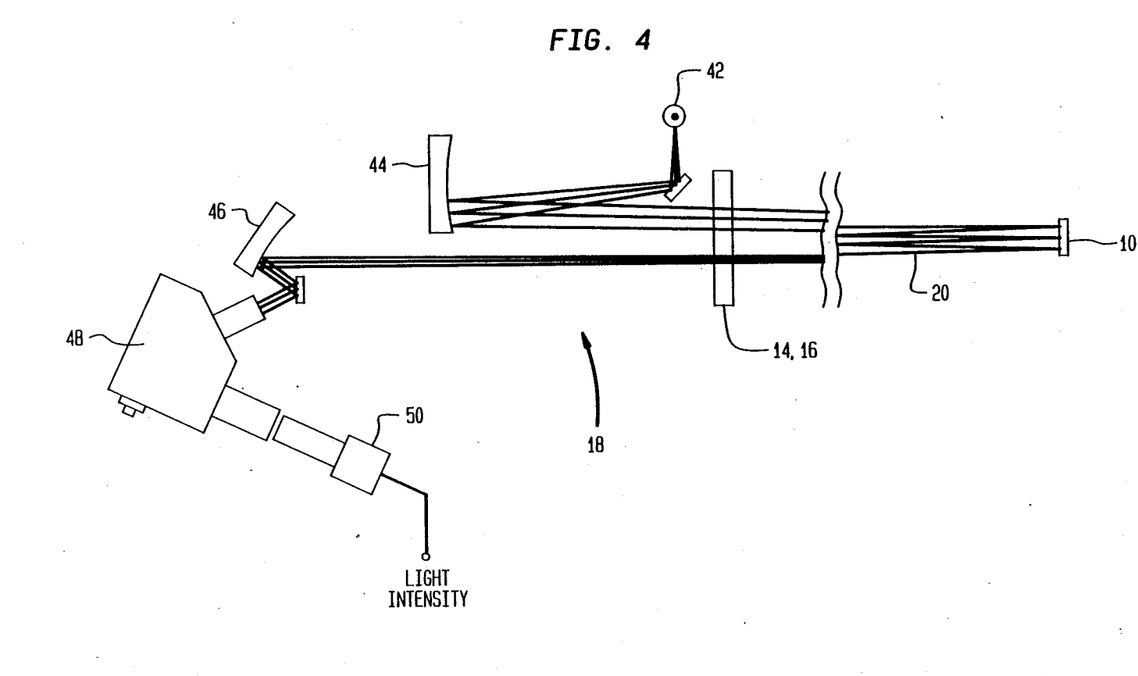
FIGS. 4 and 5 illustrate the components of the reflectance difference spectrometer.

The above references, especially reference (7), should be consulted for a full description of the preferred optics but the equipment is described briefly here. The overall optical paths are illustrated in FIG. 4. Light from a 75 W xenon light source 42 is focused by a reflector 44 to form a 5 mm spot on the substrate 10 after passing through the tubes 14 and 16 forming the OMCVD reactor chamber. The light is reflected from the substrate 10 to the outside of the tubes 12 and 14 and is focused by another reflector 46 onto a 0.1 m grating monochromator 48. Additional planar reflectors are also shown. A photomultiplier 50 receives the spectrally separated output light from the monochromator 48 and provides an electrical output indicative of the received light intensity.

Figure 5:
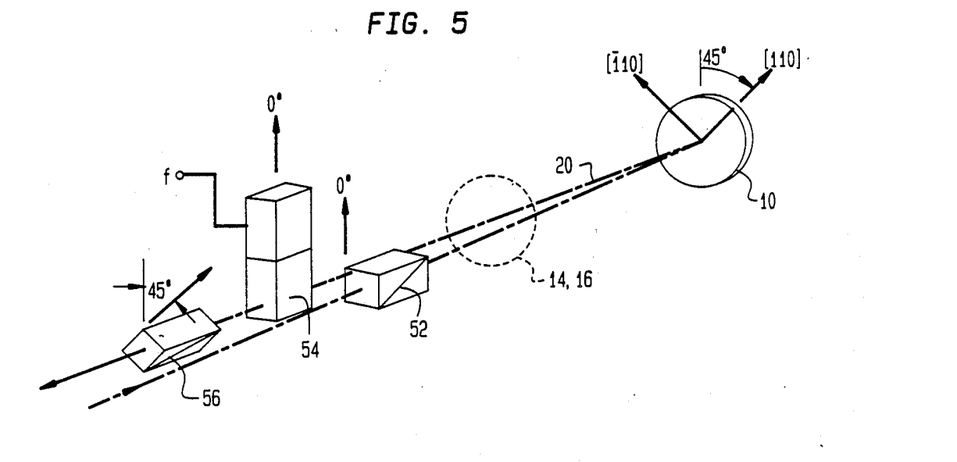

The polarizing components of the optics are illustrated in FIG. 5. The bisector of the crystalline directions [$\bar{1}$10] and [$\bar{1}$10] is taken as the 0° reference direction. The output of the xenon lamp, after reflection by the reflector 44, is passed through a polarizer 52 so that equal intensities of light polarized along [110] and [110] fall on the substrate 10. The light reflected from the substrate 10 is passed through a photoelastic modulator 54 with its reference axis aligned with the reference axis of the substrate 10. The photoelastic modulator 54, such as the PEM-80 Series 1, model FS-5, manufactured by Hinds International, Inc. of Hillsboro, Oreg., modulates birefringence so that light polarized perpendicularly to the reference axis is subjected to a sinusoidal time variation of its phase pathlength relative to the phase pathlength for light polarized along the reference axis. The modulation frequency f is 50 kHz. The optical output of the photoelastic modulator 54 passes through an analyzer 56 with its polarization axis set at 45° with respect to the reference direction of the substrate 10. The photoelastic modulator 54 and the analyzer 56 are placed in the optical path between the cylindrical tube 16 and the focusing reflector 46.

Figure 6:
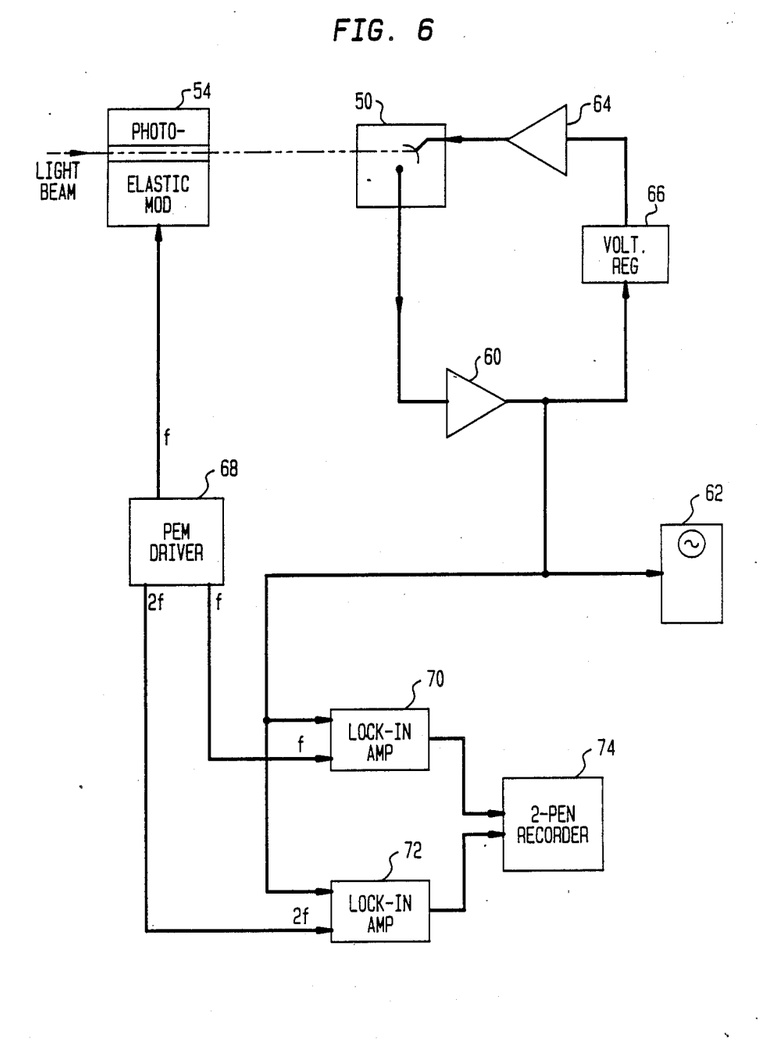
FIG. 6 is a block diagram of the electronics of the RD spectrometer.

The output of the photomultiplier 50, as illustrated in FIG. 6 is amplified by a photomultiplier preamplifier 60 and may then be directly viewed on an oscilloscope 62. The cathode of the photomultiplier 50 is powered by a photomultiplier power supply 64, which in turn is controlled by a voltage regulator 66. The voltage regulator 66 is controlled by the DC component of the output of the photomultiplier 60 since its response is slow enough that it ignores the 50 kHz and up AC components. Therefore, the gain of the photomultiplier 50 is maintained for a constant non-polarized reflectivity R.

The photoelastic modulator is driven at a frequency f (50 kHz) by a driver 68 (supplied with the modulator 54) which also outputs in synchronism two phase reference signals at frequencies f and 2f. Two lock-in amplifiers 70 and 72, referenced respectively to f and 2f, phase detect and amplify the output of the photomultiplier preamplifier 60. Their two outputs drive the respective pens of a time-base 2-pen recorder 74. The outputs are, of course, the amplitudes of the f component and the 2f components of the optical beam. As described in the previously cited reference (7), the 2f component is related to the difference in reflectances of the two polarizations and provides the data of FIGS. 7, 8 and 9.

Figure 7:
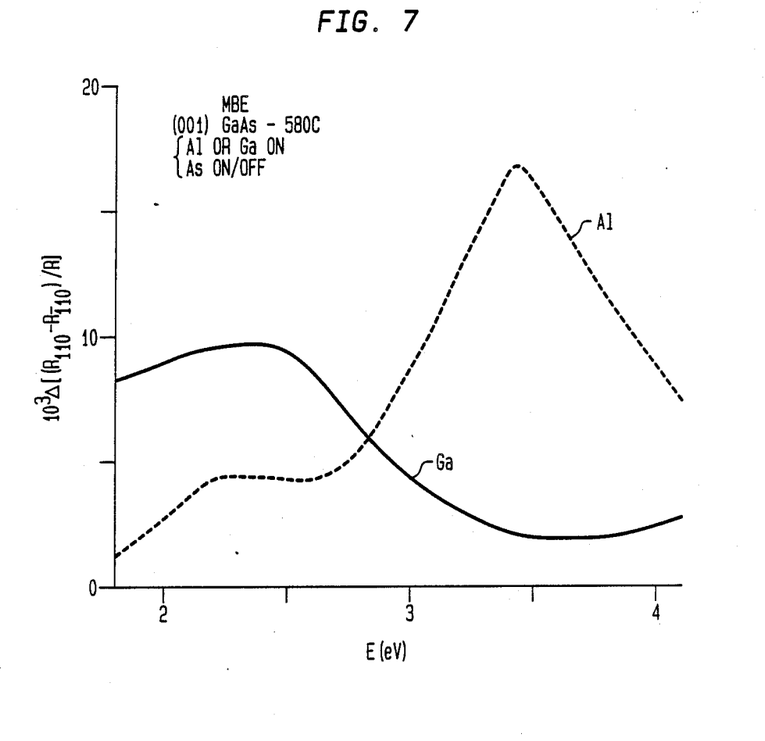
FIG. 7 is a graph of the reflectance difference spectra for GaAs and AlAs.

FIG. 7 shows RD spectra for two cases. In both cases, an (001) face of a GaAs substrate was used for MBE growth at 580° C. In one case, the substrate was exposed to both Al and As molecular beams; in the other case, to Ga and As beams. In both cases the As was then cut off and the spectrum of the RD transient was measured. The reflectance difference is normalized to one of the polarized reflectances. It is seen that the reflectance difference change is about 1% of either polarized reflectance.

From this data, supported by further results, it is felt that the Ga-Ga dimer has a peak at an optical energy of 2.48 eV, a corresponding Al-Al dimer has a peak at 3.54 eV, and possibly there is an As-As dimer at 2.2 eV.

Figure 8:
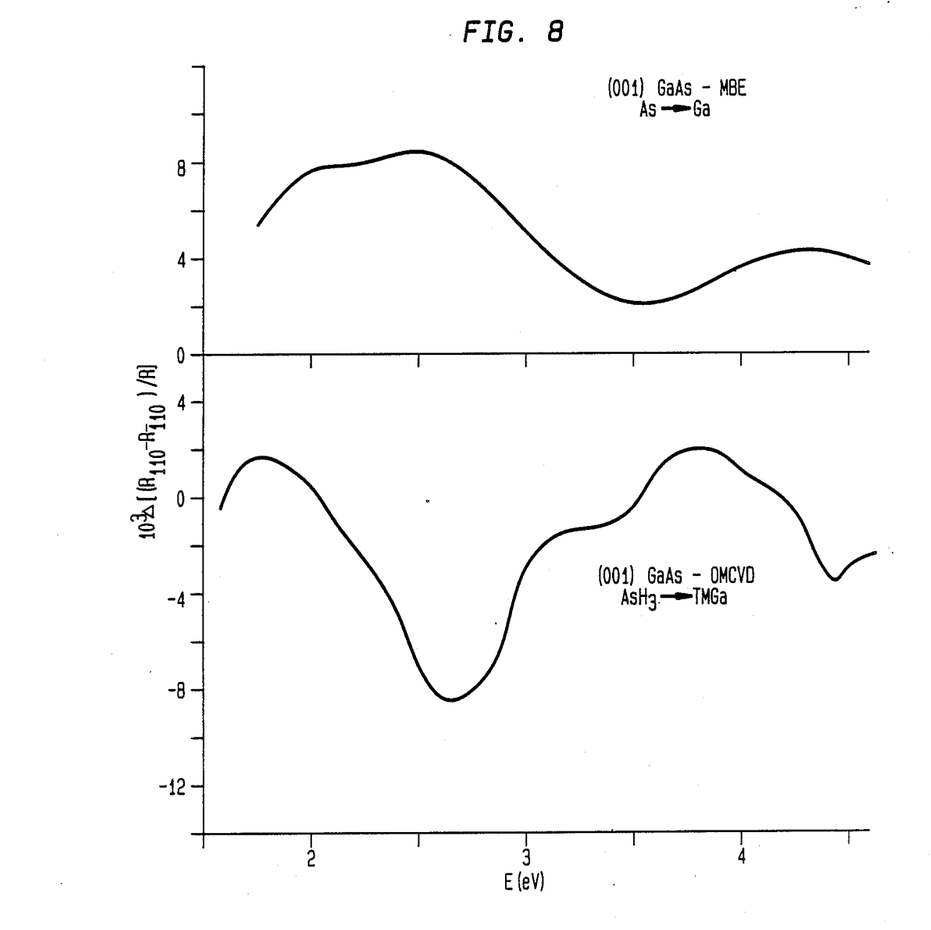
FIG. 8 illustrates the RD spectra for GaAs deposited by MBE and OMCVD.

The RD spectrum for OMCVD is not as easy to explain. In FIG. 8 are shown at top the RD spectrum for MBE-grown GaAs and at bottom the RD spectrum for OMCVD-grown GaAs. In OMCVD growth, the atmospheric-pressure ambient in the reaction chamber was changed from $H_2$ containing 320 Pa $AsH_3$ to $H_2$ containing 13.6 Pa TMGa. The OMCVD reactions were performed at 370° C. with laminar flow rates of 30 cm/s over the sample 10.

Figure 9:
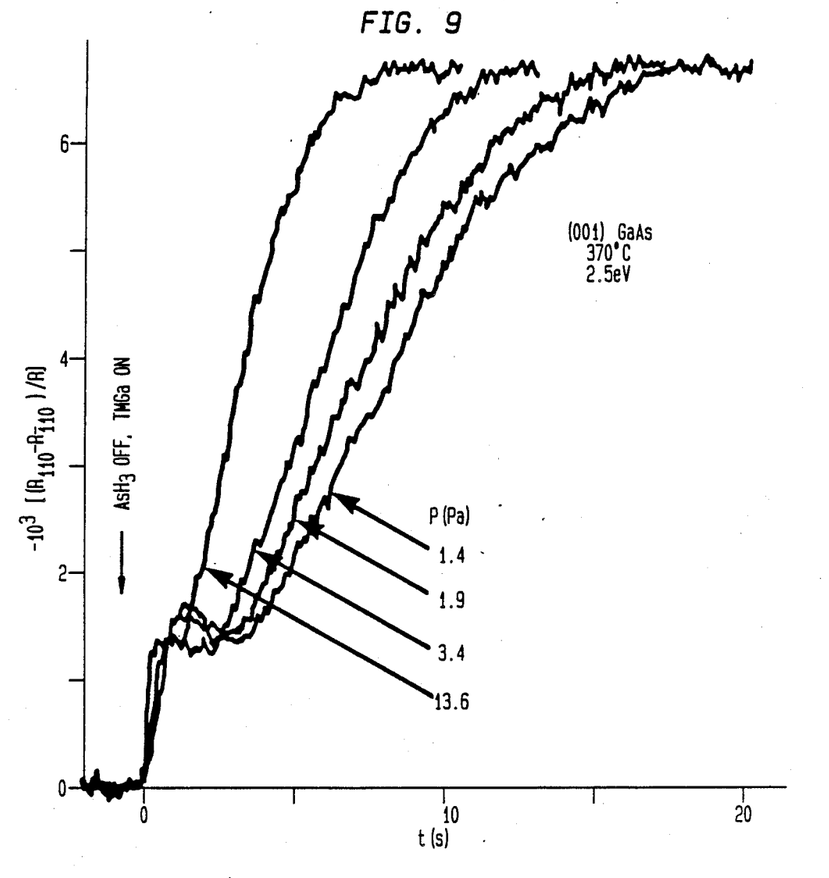
FIG. 9 illustrates the RD transient following initiation of OMCVD growth of Ga.

It is clear that the signal at 2.5 eV for OMCVD-grown GaAs is nonetheless the maximum strength signal and it is believed to be the proper wavelength for monitoring the surface chemistry. In FIG. 9 are shown transient RD responses with the monochromator 48 tuned to 2.5 eV when the OMCVD reaction chamber was changed from atmospheric $H_2$ with a $AsH_3$ partial pressure of 320 Pa to various partial pressures of TMGa. Detailed investigation of these transient responses support an interpretation that these curves, apart from the initial fluctuation, represent the amount of Ga bonded at the surface. The full range of the RD transient represents one monolayer of Ga deposited on the underlying As. The exposure time required for formation of one monolayer may be obtained from these curves. One possible rule for deriving the exposure time is as follows. The RD signal has a linear portion in the middle of its range and it asymptotically approaches a maximum value represented by a horizontal line. The asymptotic approach can be approximated by an exponential function characterized by a time constant. According to the rule, the exposure should be terminated three time constants following the point where the extrapolation of the linear portion intersects the horizontal line of the maximum value. Other rules may be derived. Continuing exposure to TMGa acts only to form Ga globules which are not crystallographically aligned and thus do not contribute directly to RD spectra. It must be emphasized that the transients of FIG. 9 are very sensitive to temperature and possible other temporally varying effects. Therefore, the RD transient must be at least occasionally monitored to determine the correct exposure time. In other words, OMCVD is sensitive to process variations and in situ monitoring of monolayer growth appears necessary.

The overall process for atomic layer epitaxy (ALE) growth of GaAs will now be described under the assumption that the ALE growth of GaAs is performed between two thicker layers of GaAlAs.

After polishing of the (001) face of a GaAs substrate, the substrate is chemically etched by a nonpreferential etch. The substrate is then placed in the OMCVD reaction chamber and any oxide is removed by sublimation while the surface is subjected to a high temperature exposure to $AsH_3$ and $H_2$. Then a buffer layer of GaAs is grown by the simultaneous supply of $AsH_3$ and TMGa. Thereafter, the actual device fabrication begins with the supply of $AsH_3$ and a carefully controlled balance of TMGa and TMAl so as to form GaAlAs. The GaAlAs growth by OMCVD is well known and will not be described further.

The ALE growth of GaAs begins by supplying only $AsH_3$ as an active gas. It is assumed that atmospheric $H_2$ is being continuously supplied as a carrier. The $AsH_3$ saturates the surface with As. When a sufficient exposure time to $AsH_3$ has passed, the $AsH_3$ is turned off and, after the $H_2$ flushes the reaction chamber, the TMGa is turned on. The operator follows the display of the RD transient, such as illustrated in FIG. 9, and when it reaches a predetermined level, he notes the elapsed time, turns off the TMGa, allows the $H_2$ to flush the system, and then turns on the $AsH_3$. The $AsH_3$ is left on for sufficient time to saturate the surface with As, whereafter the $AsH_3$ is turned off, the system is flushed and the process repeats. An $H_2$ flush of 1s following $AsH_3$ and of 3s following TMGa is sufficient. After a few such cycles, the TMGa exposure time should be settling to a set time which the operator can program into the computer 32. Thereafter, the requisite number of GaAs monolayers may be grown completely under computer control. At the termination of the GaAs ALE growth, GaAlAs is again grown by the simultaneous supply of $AsH_3$, TMGa and TMAl.

The above described process closely follows that described by Den Baars et al except for the real-time monitoring of the formation of the Ga monolayers. Because excess As sublimes or perhaps never bonds with surface As from $AsH_3$, the $AsH_3$ exposure times are not critical and may be determined beforehand, as was done by Den Baars et al.

Although it is necessary to know beforehand the full range of the RD transient, this range is relatively insensitive to fabrication processes and may even be estimated by the non-linear behavior of the RD transients.

The above-described process relied upon the operator for determining the TMGa exposure time from the RD transient. This determination may be done by the computer 32 as long as the range of the RD transient is known.

The process of the invention is of course not limited to GaAs. Other III–V compounds such as AlAs can be monitored with the correct dimer photo-energy. Ternary compounds, such as GaAlAs, are easily handled by simultaneous supply of two cation species and monitoring the peak of either one of them. II–VI compounds should show similar effects. There is no reason why the method cannot be extended to other multiple atomic crystalline systems.

The previous discussion concerned a growth control process for depositing exactly one monolayer of atoms. However, it appears clear from the graph of FIG. 9 that RD spectroscopy is capable of measuring the deposition of fractions of a monolayer. This submonolayer control allows the growth of vertical slabs of dissimilar material, as described as follows with reference to FIG. 10, for slabs of GaAs and AlAs. A similar process for use with RHEED and MBE has been disclosed by Gaines et al in a technical article entitled "Molecular-beam epitaxy growth of tilted GaAs/AlAs superlattices by deposition of fractional monolayers on vicinal (001) substrates" appearing in Journal of Vacuum Science and Technology, Vol. B6, 1988 at pages 1378 to 1381.

Figure 10:
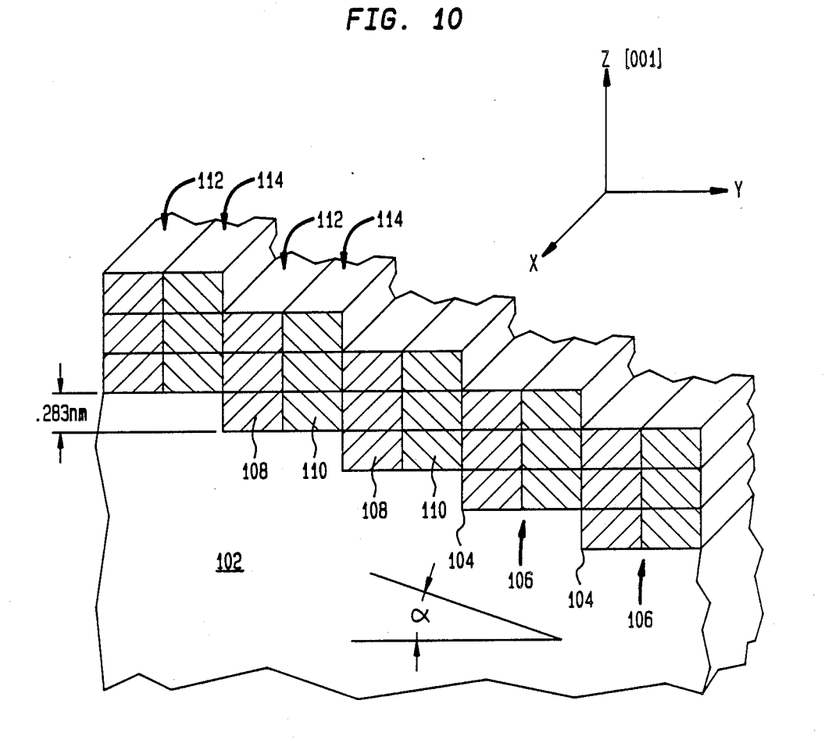
FIG. 10 illustrates growth of slabs or wires by a variant of the invention.

A crystalline substrate 102 is mechanically cut at a vicinal angle of $\alpha$ relative to its (001) crystalline face and then polished. The vicinal angle is relatively small, approximately 2°, so there results a stepped structure with the crystalline faces in steps 106 being planar and being separated by one atomic layer, 0.283 nm for GaAs.

The process relies on the fact that under certain conditions stable epitaxial growth proceeds from convex corners 104 of the substrate. That is, growth proceeds from the vertical sides between the steps 106.

After crystal cutting and surface polishing and cleaning, the substrate is exposed to AsH$_3$ and H$_2$ at 700° C. for a sufficient time that any oxide is removed and only As is exposed on the steps 106.

Then a process similar to atomic layer epitaxy is carried out which can be called partial atomic layer epitaxy. The As surface is exposed to TMGa and the RD spectrometer is monitored at the Ga wavelength. When the RD transient reaches a predetermined fraction, in this example one-half, of the full range of the Ga RD transient, the TMGa is cut off.

It is believed that at this point the Ga is in fact spread out over the steps 106. A sufficient time is allowed for the distributed Ga to migrate toward the corners 104 and form a Ga monolayer extending along one-half of the steps 106. Thereafter, the AsH$_3$ is turned on which cause As to bond to all the exposed Ga to form GaAs blocks 108.

In the next series of steps, AlAs is grown by a very similar process except that TMAl is supplied in place of the TMGa and the Al dimer peak is monitored. The TMAl is cut off when the RD transient reaches half its range. There results AlAs blocks 110, which are an AlAs monolayer thick.

At this point, a stepped monolayer of GaAs or AlAs has been formed. The process is repeated and it is seen that GaAs blocks 108 are formed over previously GaAs blocks 108. Similarly, the AlAs blocks 110 are formed in a vertical structure.

Although the process can be repeated a sufficient number of times to form two-dimensional slab structure, the process is advantageously terminated after a few monolayers to create GaAs quantum wires 112 and AlAs quantum wires 114. Both the wires 112 and 114 have heights in the z-direction of the same order of magnitude as their widths along the steps 106 in the y-direction. It is noted that FIG. 10 greatly exaggerates the height of the monolayers or blocks 108 and 110. The wires 114 and 116 however extend long distances in the x-direction. The result is a 2-dimensional quantum well, spatially quantized in the y- and z-directions but having extended states in the x-direction.

It is possible to extend the process of FIG. 10 to Group IV materials such as silicon and silicongermanium alloys. This extension requires an understanding that exposed monolayers of silicon or germanium have a lower energy if the exposed Si or Ge dimers are aligned in the cross direction of the corners 104 that is, aligned parallel to the x-direction. Therefore, stable growth tends to proceed two atomic Si monolayers at a time, one monolayer corresponding to Ga and the other to As. The top and exposed monolayer has Si dimers parallel to the illustrated x-direction. However, if the Si is deposited quickly, it deposits as a single atomic monolayer which is unstable. Thereafter, the Si diffuses to the more stable bilayer structure.

Therefore, when the Si substrate 102 is cut at the vicinal angle, the x-direction of FIG. 10 is chosen to correspond to the [110] or [$\bar{1}$10] direction of FIG. 3 so that the dimers are either parallel or perpendicular to the x-direction. The cut substrate is polished and cleaned and a buffer layer of Si in the form of silane is deposited. The substrate is then thoroughly annealed so that the steps 106 correspond to two atomic monolayers. A relatively quick OMCVD growth of Si is performed so that only a single atomic monolayer is formed having Si dimers formed perpendicularly to the corners. The RD spectrometer is monitored for complete conversion of the surface from parallel dimers to perpendicular dimers. The Si supply is cut off immediately after the conversion is complete. Thereafter, the Si is allowed to diffuse along the surface to form the more stable double atomic monolayer in the blocks 108 extending along one half of the steps 106. The diffusion can be accelerated by surface heating.

Thereafter, a mixture of Si and Ge (in the form of germane) is quickly deposited. Again, an atomic monolayer is immediately formed. The Si RD peak can again be monitored for complete surface conversion to perpendicular dimers. As soon as the conversion is complete, the Si and Ge supply is cut off and the atomic monolayer is allowed to diffuse to form the more stable blocks 110 of Si-Ge. The process is repeated to form quantum wires 112 of Si and quantum wires 114 of Si-Ge alloy.

RD spectroscopy relies on chemical effects and thus can be used for monitoring other effects than simple deposition of monolayers. For instance, when GaAs or GaAlAs is being formed with the simultaneous supply of all constituents, the smoothing of the surface following the end of growth can be monitored by an RD signal. The rearrangement of atoms, as described with reference to FIG. 10, can be monitored by RD spectroscopy with the next step beginning following completion of rearrangement. Another application involves surface strain resulting from epitaxial growth of a lattice mismatched material, for instance InAs on a GaAs substrate. The first few InAs monolayers will be lattice matched to the GaAs but, at some unknown number of monolayers, the strain will introduce defects which permits the further growth of InAs at its own lattice constant. RD spectroscopy can monitor the InAs formation and the RD spectrum will change between the defect-free, strained layers and the subsequent relaxed but defect-carrying monolayers.

RD spectroscopy is sensitive to any symmetry breaking structure. Therefore, interior interfaces in a heterostructure can be tested by RD spectroscopy. Depths to tens of monolayers can be probed, well within optical absorption lengths of 100 nm. Thus the abruptness of interior interfaces can be tested. Finally, RD spectroscopy could be used to quantitatively monitor amounts of dopant species introduced as a fraction of a monolayer within a semiconductor structure.

In view of the above descriptions, RD spectroscopy offers a simple apparatus for monitoring the surface chemistry during epitaxial formation of semiconductor monolayers. Its most immediate use is for determining the deposition times required for single monolayers. However, its chemical sensitivity provides a more flexible probe than was previously available.

What is claimed is:

1. A crystal growing apparatus comprising:
   means for depositing atoms upon a surface of a substrate; and
   optical monitoring means, operable during an operation of said depositing means, for monitoring said atoms deposited upon said surface, said optical monitoring means comprising a source of light irradiated upon said substrate and interacting with said deposited atoms, polarization detecting means for detecting respective quantities of two polarization components of a beam of light resultant from said irradiated light having interacted with said deposited atoms and differencing means for comparing said respective quantities.

2. A crystal growing apparatus as recited in claim 1, wherein said depositing means comprises a chamber containing said substrate and containing a vapor of said atoms and wherein said substrate is in crystalline form prior to said operation of said depositing means, whereby said atoms are deposited epitaxially.

3. A crystal growing apparatus as recited in claim 2, wherein said depositing means comprises organometallic chemical vapor deposition means.

4. A crystal growing apparatus as recited in claim 2, wherein said depositing means comprises means for selectively depositing atoms of a first species and depositing atoms of a second species.

5. A crystal growing apparatus as recited in claim 1, wherein said irradiated light is irradiated upon a free surface of said substrate and said resultant light is reflected from said free surface.

6. A crystal growing apparatus as recited in claim 5, wherein said detected quantities are intensities of said two polarization components of said resultant light.

7. A crystal growing apparatus as recited in claim 6, wherein said polarization detecting means consists of optical elements receiving said light, one optical intensity detector receiving an output of said optical elements and electronic circuitry receiving an output of said detector.

8. A crystal growing apparatus as recited in claim 6, further comprising automatic means responsive to said detected quantities for controlling said depositing means.

9. A crystal growing apparatus as recited in claim 1, wherein said depositing means comprises molecular beam epitaxy means.

10. A method of growing a crystal, comprising the steps of:
depositing atoms upon a surface of a substrate;
irradiating said substrate with light during said depositing step and causing said irradiated light to reflect resultant light in a first direction;
detecting in said first direction two respective quantities of orthogonal polarization components of said resultant light;
differencing said two quantities to produce an output representative of an amount of said atoms deposited upon said surface; and
controlling said depositing step in response to said output of said differencing step.

11. A method as recited in claim 10, wherein said substrate is crystalline.

12. A method as recited in claim 11, wherein said depositing step comprises vapor phase epitaxy.

13. A method as recited in claim 11, wherein said depositing step includes alternating a first step of depositing atoms of a first species and a second step of depositing atoms of a second species and wherein said first step is terminated in response to said output of said differencing step and said second step is begun thereafter.

14. A method as recited in claim 11, further comprising cutting said crystalline substrate at a vicinal angle to a crystal face of said substrate and processing said cut substrate to provide a stepped surface thereon prior to said depositing step, said stepped surface having substantially equal sized steps projecting in a same direction and arranged on a substantially equal period.

15. A method as recited in claim 14, wherein said depositing step alternately deposits Group III atoms and Group V atoms.

16. A method as recited in claim 14, wherein said depositing step deposits Group IV atoms.

17. A method as recited in claim 10, wherein said depositing step deposits dopant atoms in a fraction of a monolayer.

18. A method as recited in claim 10, wherein said differencing step comprises modulating a birefringence in a birefringent medium placed in a path of at least one of said irradiated light and said resultant light.

19. A method as recited in claim 11, wherein said depositing step comprises molecular beam epitaxy.

* * * * *